United States Patent
Pattipaka et al.

(10) Patent No.: US 10,319,362 B2
(45) Date of Patent: Jun. 11, 2019

(54) HIGH SPEED LEVEL SHIFTER FOR HIGH VOLTAGE APPLICATIONS

(71) Applicant: TEXAS INSTRUMENTS INCORPORATED

(72) Inventors: Ravikumar Pattipaka, Bangalore (IN); Raja Sekhar Kanakamedala, Bangalore (IN); Aravind Miriyala, Bangalore (IN); Sandeep Kesrimal Oswal, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/793,537

(22) Filed: Oct. 25, 2017

(65) Prior Publication Data

US 2018/0122360 A1 May 3, 2018

(30) Foreign Application Priority Data

Oct. 27, 2016 (IN) .............................. 201641036794

(51) Int. Cl.
| | |
|---|---|
| *G10K 11/34* | (2006.01) |
| *H03K 17/687* | (2006.01) |
| *H03K 19/003* | (2006.01) |
| *H03K 3/356* | (2006.01) |
| *G10K 11/04* | (2006.01) |

(Continued)

(52) U.S. Cl.
CPC .......... *G10K 11/341* (2013.01); *B06B 1/0207* (2013.01); *G06F 1/3203* (2013.01); *G10K 11/04* (2013.01); *G11C 11/413* (2013.01); *H03K 3/356113* (2013.01); *H03K 17/08* (2013.01); *H03K 17/6871* (2013.01); *H03K 19/00361* (2013.01); *H03K 19/018507* (2013.01);

(Continued)

(58) Field of Classification Search
CPC ....... H03K 19/0016; H03K 19/018521; H03K 17/063; H03K 19/0013; H03K 19/00361; H03K 19/01855; H03K 19/09429; H03K 3/356113; H03K 17/08; H03K 17/56; H03K 17/6871; H03K 19/018507; H03K 2217/0063; H03K 17/687; G11C 7/1051; G11C 7/1057; G11C 7/106; G11C 11/413; G10K 11/341; G10K 11/04; B06B 1/0207; G06F 1/3203
See application file for complete search history.

(56) References Cited

U.S. PATENT DOCUMENTS

| | | | | |
|---|---|---|---|---|
| 6,677,797 B2* | 1/2004 | Kameyama | ........ | H03K 19/0016 326/80 |
| 6,753,697 B2* | 6/2004 | Nakase | ............. | H03K 19/0013 326/56 |

(Continued)

*Primary Examiner* — Vibol Tan
(74) *Attorney, Agent, or Firm* — John R. Pessetto; Charles A. Brill; Frank D. Cimino

(57) ABSTRACT

The disclosure provides a level shifter. The level shifter includes a first logic block that receives an input signal and generates a primary pulsed input. A first transistor is coupled to the first logic block and a first node. A gate terminal of the first transistor receives the primary pulsed input. A latch is coupled to the first node and a second node. A second logic block receives the input signal and generates a secondary pulsed input. A second transistor is coupled between the second logic block and the second node. A gate terminal of the second transistor receives the secondary pulsed input.

18 Claims, 4 Drawing Sheets

Figure 1:
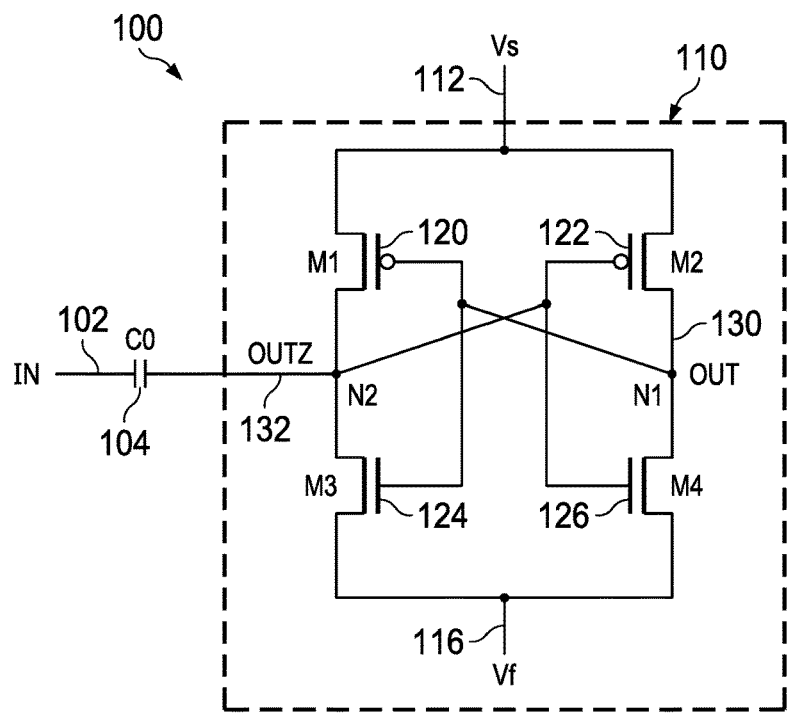

(51) Int. Cl.
  *G06F 1/3203* (2019.01)
  *H03K 17/08* (2006.01)
  *G11C 11/413* (2006.01)
  *H03K 19/0185* (2006.01)
  *B06B 1/02* (2006.01)
  *H03K 17/56* (2006.01)
(52) U.S. Cl.
  CPC ........... *H03K 17/56* (2013.01); *H03K 17/687* (2013.01); *H03K 2217/0063* (2013.01)

(56) References Cited

U.S. PATENT DOCUMENTS

| | | | | |
|---|---|---|---|---|
| 7,692,456 B2* | 4/2010 | Hanazawa | ............ | H02M 7/538 327/108 |
| 8,797,783 B1* | 8/2014 | Bartling | ................ | G11C 11/221 365/109 |
| 8,817,520 B2* | 8/2014 | Khanna | ................ | G11C 11/221 365/145 |
| 8,897,088 B2* | 11/2014 | Bartling | ................ | G11C 29/08 365/154 |

\* cited by examiner

HIGH SPEED LEVEL SHIFTER FOR HIGH VOLTAGE APPLICATIONS

CROSS REFERENCES TO RELATED APPLICATIONS

This application claims priority from India provisional patent application No. 201641036794 filed on Oct. 27, 2016 which is hereby incorporated by reference in its entirety.

TECHNICAL FIELD

The present disclosure is generally related to transmitters and more particularly to transmitters in ultrasound front end systems.

BACKGROUND

Ultrasonic imaging has become a widely used tool in medical diagnostics. Ultrasound techniques introduce high-frequency acoustic waves into a subject's body. Ultrasound system includes a transmitter that generates an electrical energy. This electrical energy is converted into acoustic energy by a transducer integrated within the ultrasound system. The acoustic energy or ultrasound signals are transmitted to the subject's body, from an ultrasound probe, and, in response, echoes of the acoustic energy are reflected from various acoustic impedance discontinuities within the body.

The echoes are received by the transducer. The echoes (or the reflected ultrasound signals) are amplified and digitized to generate an ultrasound image of the subject. The received echoes of those waves provide information allowing a trained observer to view the subject's internal organs.

The receiver in the ultrasound system is designed in low voltage technology. The transmitter in the ultrasound system is designed in high voltage technology. It can be a pulsed or a linear transmitter. The transmitter utilizes a level shifter whose function is to level shift an input signal in a low voltage domain to high voltage domain. However, the level shifter used in existing ultrasound systems has various shortcomings, such as (a) not immune to high supply transients; (b) large area on account of high voltage transistors; and/or (c) does not support high operating frequencies.

SUMMARY

According to an aspect of the disclosure, a level shifter is disclosed. The level shifter includes a first logic block that receives an input signal and generates a primary pulsed input. A first transistor is coupled to the first logic block and a first node. A gate terminal of the first transistor receives the primary pulsed input. A latch is coupled to the first node and a second node. A second logic block receives the input signal and generates a secondary pulsed input. A second transistor is coupled between the second logic block and the second node. A gate terminal of the second transistor receives the secondary pulsed input.

BRIEF DESCRIPTION OF THE VIEWS OF DRAWINGS

Figure 2:
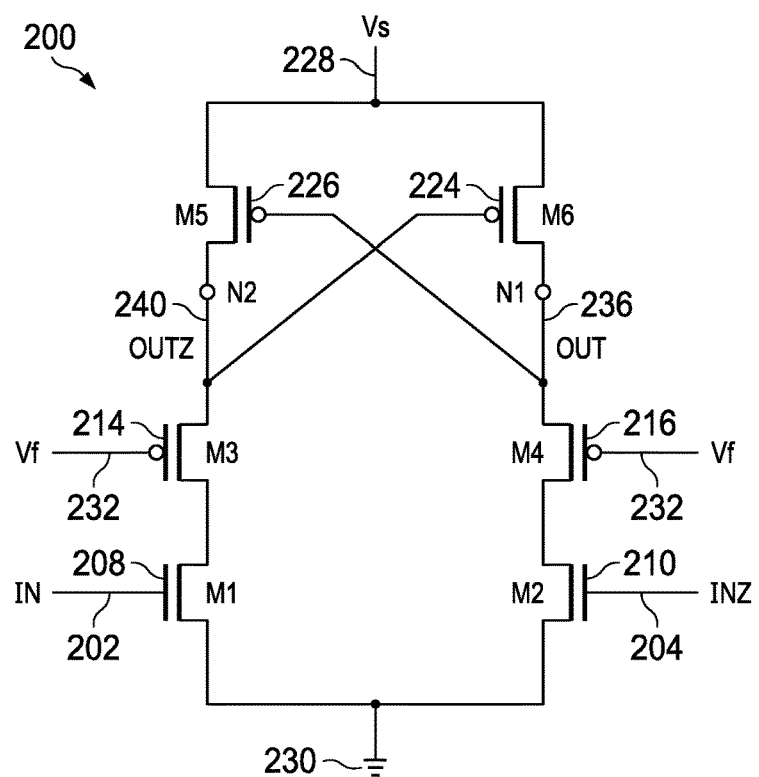
Figure 3:
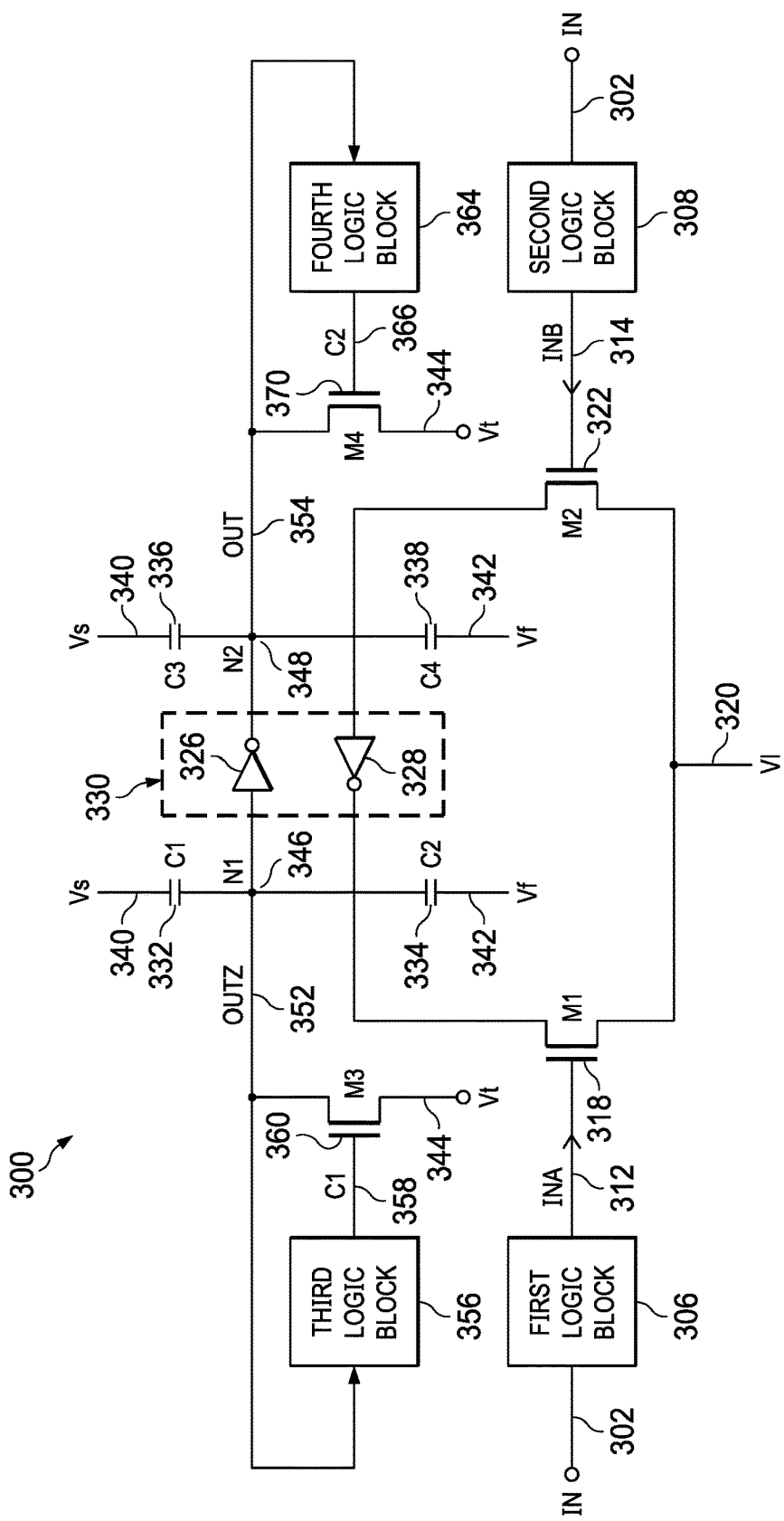
Figure 4:
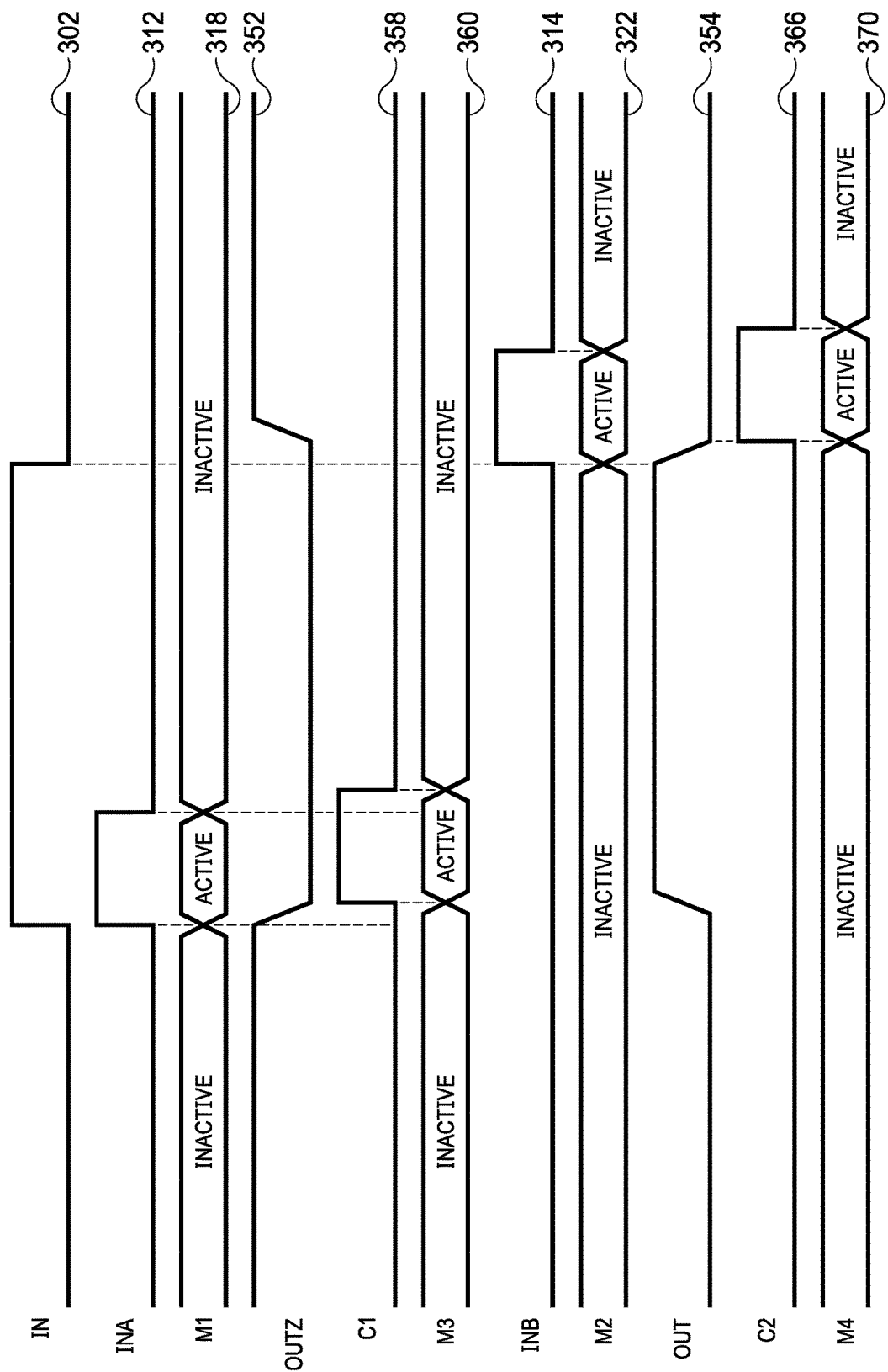
Figure 5:
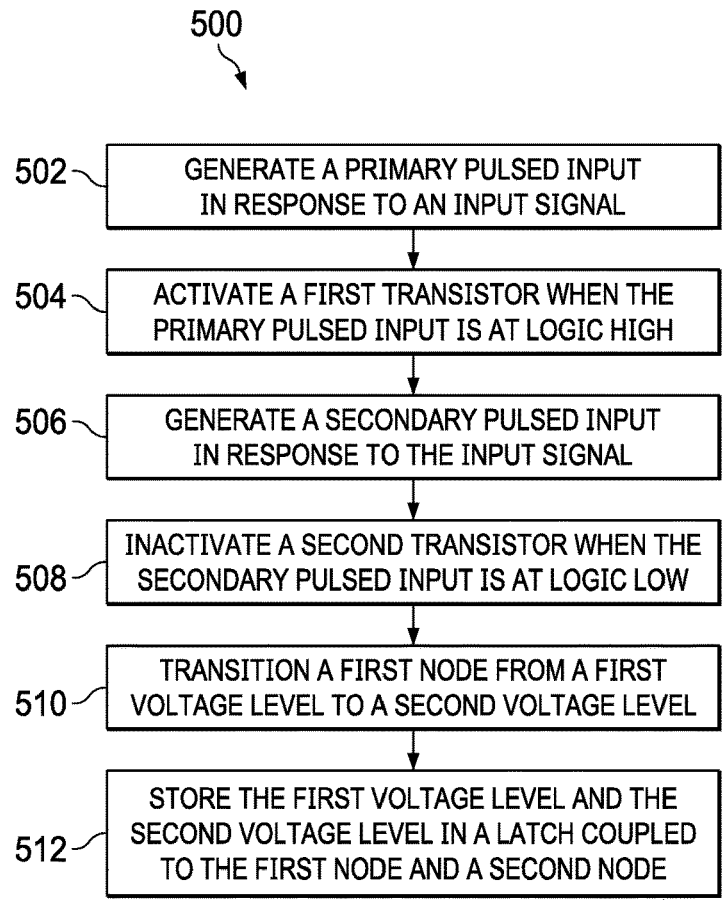
Figure 6:
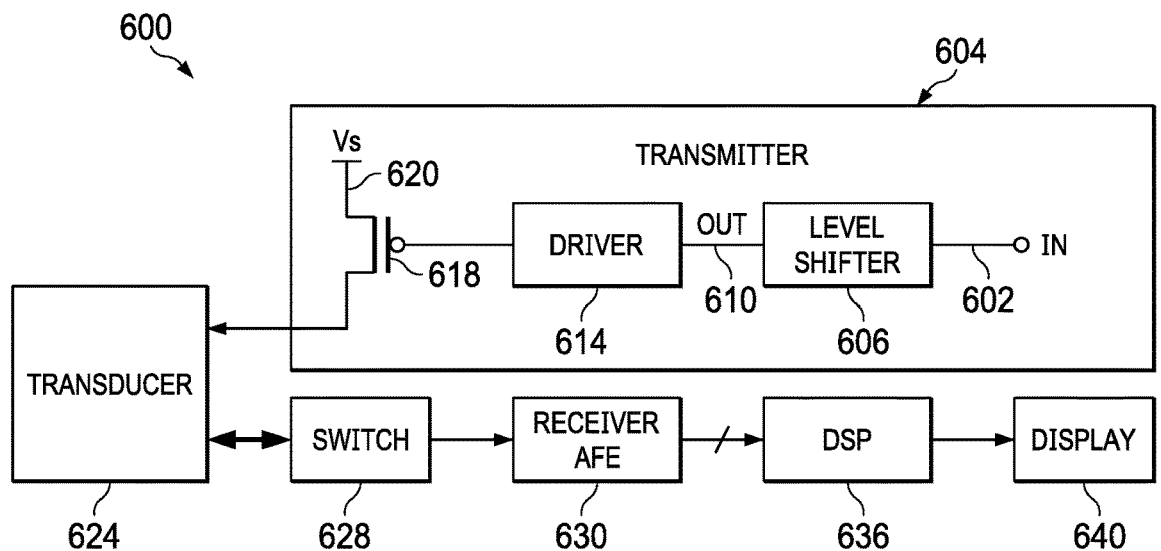

FIG. 1 illustrates a level shifter;
FIG. 2 illustrates a level shifter;
FIG. 3 illustrates a level shifter, according to an embodiment;
FIG. 4 is a timing diagram for illustrating the operation of a level shifter, according to an embodiment;
FIG. 5 is a flowchart illustrating a method of operation of a level shifter, according to an embodiment; and
FIG. 6 illustrates a block diagram of an ultrasound system, according to an embodiment.

DETAILED DESCRIPTION OF THE EMBODIMENTS

FIG. 1 illustrates a level shifter 100. The level shifter 100 receives an input signal IN 102. The level shifter 100 includes a first capacitor C0 coupled to a latch 110. The latch 110 includes a first transistor M1 120, a second transistor M2 122, a third transistor M3 124 and a fourth transistor M4 126. The latch 110 is coupled to a voltage supply source Vs 112 and a fixed voltage source Vf 116. A gate terminal of each of the first transistor M1 120 and the third transistor M3 124 are coupled to each other and also coupled to a node N1. Similarly, a gate terminal of each of the second transistor M2 122 and the fourth transistor M4 126 are coupled to each other and also coupled to a node N2.

A drain terminal of each of the first transistor M1 120 and the third transistor M3 124 are coupled to the node N2. A drain terminal of each of the second transistor M2 122 and the fourth transistor M4 126 are coupled to the node N1. A source terminal of each of the first transistor M1 120 and the second transistor M2 122 are coupled to the voltage supply source Vs 112. A source terminal of each of the third transistor M3 124 and the fourth transistor M4 126 are coupled to the fixed voltage source Vf 116.

The operation of the level shifter 100 is explained now. The input signal IN 102 can be a logic low signal or a logic high signal. In one example, the logic low signal is 0 volt and the logic high signal is 5V. The first capacitor C0 104, in one version, is a high voltage capacitor. When the input signal IN 102 transitions from logic high to logic low, the second transistor M2 122 is activated, and hence the node N1 is at logic high. Hence, an output signal OUT 130 generated at the node N1 is at logic high. This results in inactivation of the first transistor M1 120, and hence results in logic low at node N2.

An inverted output signal OUTZ 132 generated at the node N2 is at logic low. In one example, the voltage supply source Vs 112 is 100 volt, and the fixed voltage source Vf 116 is 95 volt. In such case, the logic high of the output signal OUT 130 is at 100 volt, and the logic low of the inverted output signal OUTZ 132 is at 95 volt.

When the input signal IN 102 transitions from logic low to logic high, the second transistor M2 122 is inactivated, and hence the node N1 is at logic low. Hence, the output signal OUT 130 generated at the node N1 is at logic low. This results in activation of the first transistor M1 120, and hence results in logic high at node N2. The inverted output signal OUTZ 132 generated at the node N2 is at logic high.

The advantage of the level shifter 100 is that it does not use any high voltage transistors. All the transistors, the first transistor M1 120, the second transistor M2 122, the third transistor M3 124 and the fourth transistor M4 126, are low voltage transistors. This provides a faster frequency of operation and results in usage of low area in a transmitter of an ultrasound system. The level shifter 100 has no static power losses, and the dynamic power losses are minimal. Since, all the transistors used in level shifter 100 are low voltage transistors; a load capacitance contributed by these transistors is insignificant.

The problem with the level shifter 100 is that it is not immune to high transients in the voltage supply source Vs 112. For example, when the input signal IN 102 is at logic high, the output signal OUT 130 is at logic low and the inverted output signal OUTZ 132 is at logic high. When the voltage supply source Vs 112 is 100 volt and the fixed voltage source Vf 116 is 95 volt, in one state, the output signal OUT 130 is at 95 volt and the inverted output signal OUTZ 132 is at 100 volt. Now, because of transients, if the voltage supply source Vs 112 switches to 105 volt and the fixed voltage source Vf 116 switches to 100 volt, the output signal OUT 130 will transition to 105 volt and the inverted output signal OUTZ 132 remain at 100 volt. Now, the output signal OUT 130 is at logic high, and the inverted output signal OUTZ is at logic low. Thus, the transient in the voltage supply source Vs 112 resulted in undesired toggling of the outputs of the level shifter 100. Therefore, the level shifter 100 is not reliable because of the transients present in the voltage supply source Vs 112.

FIG. 2 illustrate a level shifter 200. The level shifter 200 receives an input signal IN 202 and an inverted input signal INZ 204. The level shifter 200 includes a first transistor M1 208, a second transistor M2 210, a third transistor M3 214, a fourth transistor M4 216, a fifth transistor M5 226 and a sixth transistor M6 224.

The level shifter 200 also includes a voltage supply source Vs 228 and a fixed voltage source Vf 232. A gate terminal of the first transistor M1 208 receives the input signal IN 202 and the gate terminal of the second transistor M2 210 receives the inverted input signal INZ 204. A source terminal of each of the first transistor M1 208 and the second transistor M2 210 is coupled to a ground terminal 230. A gate terminal of each of the third transistor M3 214 and the fourth transistor M4 216 are coupled to the fixed voltage source Vf 232

A drain terminal of the third transistor M3 214 is coupled to a drain terminal of the first transistor M1 208. Similarly, a drain terminal of the fourth transistor M4 216 is coupled to a drain terminal of the second transistor M2 210. A source terminal of the third transistor M3 214 is coupled to a node N2 and a source terminal of the fourth transistor M4 216 is coupled to a node N1.

For the fifth transistor M5 226, a gate terminal is coupled to the node N1, a source terminal is coupled to the voltage supply source Vs 228 and a drain terminal is coupled to the node N2. For the sixth transistor M6 224, a gate terminal is coupled to the node N2, a source terminal is coupled to the voltage supply source Vs 228 and a drain terminal is coupled to the node N1.

The operation of the level shifter 200 is explained now. The input signal IN 202 can be a logic low signal or a logic high signal. In one example, the logic low signal is 0 volt and the logic high signal is 5V. The inverted input signal INZ 204 is complementary to the input signal IN 202. When the input signal IN 202 is at logic high, the first transistor M1 208 is activated and the second transistor M2 210 is inactivated. Hence, the node N2 transitions to logic low. As a result, an inverted output signal OUTZ 140 generated at the node N2 is at logic low. This results in activation of the sixth transistor M6 224, and hence results in logic high at node N1.

An output signal OUT 236 generated at the node N1 is at logic high. In one example, the voltage supply source Vs 228 is 100 volt, and the fixed voltage source Vf 232 is 95 volt. In such case, the logic low of the inverted output signal OUTZ 140 is at 95 volt, and the logic high of the output signal OUT 236 is at 100 volt.

When the input signal IN 202 is at logic low, the first transistor M1 208 is inactivated and the second transistor M2 210 is activated. Hence, the node N1 transitions to logic low. As a result, the output signal OUT 236 generated at the node N1 is at logic low. This results in activation of the fifth transistor M5 226, and hence results in logic high at node N2. The inverted output signal OUTZ 140 generated at the node N2 is at logic high.

The advantage of the level shifter 200 is that it is immune to high transients in the voltage supply source Vs 228. The nodes N1 and N2 are referred to high supply signal (voltage supply source Vs 228) only. These nodes are shielded from the low supply signals (input signal IN 202 and the inverted input signal INZ 204) by the third transistor M3 214 and the fourth transistor M4 216.

The problem with the level shifter 200 is that it uses high voltage transistors. The transistors, the first transistor M1 208, the second transistor M2 210, the third transistor M3 214 and the fourth transistor M4 216, are high voltage transistors. This provides a slower frequency of operation and results in usage of high area in a transmitter of an ultrasound system. The level shifter 200 also suffers from dynamic power losses. Since, the transistors used in level shifter 200 are high voltage transistors; a load capacitance contributed by these transistors is significant. Therefore, the level shifter 200 is not efficient to be used in an ultrasound system because of presence of high voltage transistors.

FIG. 3 illustrates a level shifter 300, according to an embodiment. The level shifter 300 receives an input signal IN 302. The level shifter 300 includes a first logic block 306, a second logic block 308, a third logic block 356 and a fourth logic block 364. The first logic block 306 and the second logic block 308 receive the input signal IN 302. The level shifter 300 includes a first transistor M1 318, a second transistor M2 322, a third transistor M3 360 and a fourth transistor M4 370.

The first transistor M1 318 is coupled between the first logic block 306 and a first node N1 346. The second transistor M2 322 is coupled between the second logic block 308 and a second node N2 348. A gate terminal of the first transistor M1 318 is coupled to the first logic block 306, and a gate terminal of the second transistor M2 322 is coupled to the second logic block 308. A source terminal of each of the first transistor M1 318 and the second transistor M2 322 is coupled to a low voltage terminal Vl 320. In one example, the low voltage terminal Vl 320 is a ground terminal.

The level shifter 300 includes a latch 330 coupled to the first node N1 346 and the second node N2 348. The latch 330 includes a first inverter 326 whose input terminal is coupled to the first node N1 346 and whose output terminal is coupled to the second node N2 348. The latch 330 also includes a second inverter 328 whose input terminal is coupled to the second node N2 348 and to the output terminal of the first inverter 326. An output terminal of the second inverter 328 is coupled to the first node N1 346 and the input terminal of the first inverter 326. Thus, the latch is a back-to-back inverter. In one version, the latch is an SR latch or any other memory storing element known in the art.

The first node N1 346 and the second node N2 348 are coupled to a voltage supply source Vs 340. The level shifter 300 also includes a first capacitor C1 332, a second capacitor C2 334, a third capacitor C3 336 and a fourth capacitor C4 338. The first capacitor C1 332 is coupled between the voltage supply source Vs 340 and the first node N1 346. The second capacitor C2 334 is coupled between the first node N1 346 and a fixed voltage source Vf 342. The third capacitor C3 336 is coupled between the voltage supply source Vs 340 and the second node N2 348. The fourth capacitor C4 338 is coupled between the second node N2 348 and the fixed voltage source Vf 342. The arrangement of these capacitors, as illustrated, is only one of the many ways of implementing and variations, and alternative constructions are apparent and well within the spirit and scope of the disclosure.

The third logic block 356 is coupled to the first node N1 346. A gate terminal of the third transistor M3 360 is coupled to the third logic block 356. A source terminal of the third transistor M3 360 is coupled to a threshold voltage source Vt 344 and a drain terminal is coupled to the first node N1 346. The fourth logic block 364 is coupled to the second node N2 348. A gate terminal of the fourth transistor M4 370 is coupled to the fourth logic block 364. A source terminal of the fourth transistor M4 370 is coupled to the threshold voltage source Vt 344 and a drain terminal is coupled to the second node N2 348. The level shifter 300 may include one or more additional components known to those skilled in the relevant art and are not discussed here for simplicity of the description.

The operation of the level shifter 300 is explained now. The input signal IN 302 can be a logic low signal or a logic high signal. In one example, the logic low signal is 0 volt and the logic high signal is 5V. The first logic block 306 generates a primary pulsed input INA 312 in response to the input signal IN 302. The primary pulsed input INA 312 is generated at a rising edge of the input signal IN 302. A duty cycle of the primary pulsed input INA 312 is less than a duty cycle of the input signal IN 302.

The second logic block 308 generates a secondary pulsed input INB 314 in response to the input signal IN 302. The secondary pulsed input INB 314 is generated at a falling edge of the input signal IN 302. A duty cycle of the secondary pulsed input INB 314 is less than the duty cycle of the input signal IN 302.

When the input signal IN 302 transitions from logic low to logic high, the primary pulsed input INA 312 transitions to logic high while the secondary pulsed input INB 314 remains at logic low. The first transistor M1 318 is activated when the primary pulsed input INA 312 is at logic high. The second transistor M2 322 remains inactivated when the secondary pulsed input INB 314 is at logic low.

The first node N1 346 transitions from a first voltage level to a second voltage level. In one example, the first voltage level is equivalent to the voltage supply source Vs 340 and the second voltage level is equivalent to the fixed voltage source Vf 342. The first voltage level and the second voltage level are stored in the latch 330. An inverted output signal OUTZ 352 generated at the first node N1 346 is at logic low whereas an output signal OUT 354 generated at the second node N2 348 is at logic high.

For example, when the input signal IN 302 transitions to logic high for example from 0 volt to 5 volt, the primary pulsed input INA 312 transitions to logic high and the secondary pulsed input INB 314 remains at logic low. This activates the first transistor M1 318 and the second transistor M2 322 remains in inactivated state. When the voltage supply source Vs 340 is, for example, 100 volt; and the fixed voltage source Vf 342 is, for example, 95 volt; the first node N1 346 transitions from 100 volt to 95 volt.

Since, the second transistor M2 322 is inactive, the second node N2 348 transitions from 95 volt to 100 volt. The first voltage level i.e. 100 volt is stored at the output terminal of the first inverter 326, and the second voltage level i.e. 95 volt is stored at the input terminal of the first inverter 326. The inverted output signal OUTZ 352 generated at the first node N1 346 is at 95 volt which is considered as logic low whereas the output signal OUT 354 generated at the second node N2 348 is at 100 volt which is considered as logic high.

The third logic block 356 and the third transistor M3 360 maintain the first node N1 346 at a fixed voltage level. When the first node N1 346 transitions from the first voltage level to the second voltage level, the third logic block 356 generates a first control signal C1 358. In one case, the first control signal C1 358 is a pulsed signal. The third transistor M3 360 is activated by the first control signal C1 358. This maintains the first node N1 346 at the fixed voltage level. In one example, the fixed voltage level is equal to the threshold voltage source Vt 344. In the example discussed in the last two paragraphs, when the fixed voltage source Vf 342 is at 95 volt and the threshold voltage source Vt 344 is also at 95 volt, the third logic block 356 and the third transistor M3 360 maintain the first node N1 346 at 95 volt.

In one version, when the latch 330 is a back to back inverter (as illustrated in FIG. 3) with the first inverter 326 and the second inverter 328, the fixed voltage level is equal to the second voltage level. In another version, when the latch 330 is an SR latch, the fixed voltage level is equal to the first voltage level.

The other case, when the input signal IN 302 transitions from logic high to logic low is explained now. When the input signal IN 302 transitions from logic high to logic low, the secondary pulsed input INB 314 transitions to logic high while the primary pulsed input INA 312 remains at logic low. The second transistor M2 322 is activated when the secondary pulsed input INB 314 is at logic high. The first transistor M1 318 remains inactive as the primary pulsed input INA 312 is at logic low.

The second node N2 348 transitions from a first voltage level to a second voltage level. In one example, the first voltage level is equivalent to the voltage supply source Vs 340 and the second voltage level is equivalent to the fixed voltage source Vf 342. The first voltage level and the second voltage level are stored in the latch 330. The inverted output signal OUTZ 352 generated at the first node N1 346 is at logic high whereas the output signal OUT 354 generated at the second node N2 348 is at logic low.

For example, when the input signal IN 302 transitions to logic low for example from 5 volt to 0 volt, the secondary pulsed input INB 314 transitions to logic high and the primary pulsed input INA 312 remains at logic low. This activates the second transistor M2 322 and the first transistor M1 318 remains in inactivated state. When the voltage supply source Vs 340 is, for example, 100 volt; and the fixed voltage source Vf 342 is, for example, 95 volt; the second node N2 348 transitions from 100 volt to 95 volt.

Since, the first transistor M1 318 is inactive, the first node N1 346 transitions from 95 volt to 100 volt. The first voltage level i.e. 100 volt is stored at the input terminal of the first inverter 326, and the second voltage level i.e. 95 volt is stored at the output terminal of the first inverter 326. The inverted output signal OUTZ 352 generated at the first node N1 346 is at 100 volt which is considered as logic high whereas the output signal OUT 354 generated at the second node N2 348 is at 95 volt which is considered as logic low.

The fourth logic block 364 and the fourth transistor M4 370 maintain the second node N2 348 at the fixed voltage level. When the second node N2 348 transitions from the first voltage level to the second voltage level, the fourth logic block 364 generates a second control signal C2 366. In one case, the second control signal C2 366 is a pulsed signal. The fourth transistor M4 370 is activated by the second control signal C2 366. This maintains the second node N2 348 at the fixed voltage level. In one example, the fixed voltage level is equal to the threshold voltage source Vt 344. In the example discussed in the last two paragraphs, when the fixed voltage source Vf 342 is at 95 volt and the threshold voltage source Vt 344 is also at 95 volt, the fourth logic block 364 and the fourth transistor M4 370 maintain the second node N2 348 at 95 volt.

In one version, when the latch 330 is a back to back inverter (as illustrated in FIG. 3) with the first inverter 326 and the second inverter 328, the fixed voltage level is equal to the second voltage level. In another version, when the latch 330 is an SR latch, the fixed voltage level is equal to the first voltage level.

The first capacitor C1 332, the second capacitor C2 334, the third capacitor C3 336 and the fourth capacitor C4 338 protect the level shifter 300 from high transients in the voltage supply source Vs 340. The first node N1 346 and the second node N2 348 are strongly coupled to the voltage supply source Vs 340 and the fixed voltage source Vf 342 by the first capacitor C1 332, the second capacitor C2 334, the third capacitor C3 336 and the fourth capacitor C4 338. Hence, the first node N1 346 and the second node N2 348 follow the transients in the voltage supply source Vs 340 and the fixed voltage source Vf 342 which prevents toggling of states.

The level shifter 300 uses only two high voltage transistors i.e. the first transistor M1 318 and the second transistor M2 322. Hence, the level shifter 300 can operate at higher frequency of operation, and also requires low area when compared to the level shifter 200. Unlike, the level shifter 100, the level shifter 300 is immune to supply transients. The first logic block 306 and the second logic block 308 ensure that the first transistor M1 318 and the second transistor M2 322 are activated, respectively, for a short duration. This ensures that the level shifter 300 has no static power losses.

The level shifter 300 provides a better delay matching across P/N which results in good linearity. The third logic block 356 and the fourth logic block 364 acts as dynamic voltage limiter circuits for the inverted output signal OUTZ 352 and the output signal OUT 354 respectively, which ensures reliability of the level shifter 300. The third logic block 356 and the fourth logic block 364 along with the third transistor M3 360 and the fourth transistor M4 370 aid in fast recovery as compared to using p-n diodes or Zener diodes as voltage limiters.

FIG. 4 is a timing diagram for illustrating the operation of a level shifter, according to an embodiment. The figure is explained in reference to the level shifter 300 illustrated in FIG. 3. The input signal IN 302 can be a logic low signal or a logic high signal. In one example, the logic low signal is 0 volt and the logic high signal is 5V. The first logic block 306 generates a primary pulsed input INA 312 in response to the input signal IN 302. The primary pulsed input INA 312 is generated at a rising edge of the input signal IN 302. A duty cycle of the primary pulsed input INA 312 is less than a duty cycle of the input signal IN 302.

The second logic block 308 generates a secondary pulsed input INB 314 in response to the input signal IN 302. The secondary pulsed input INB 314 is generated at a falling edge of the input signal IN 302. A duty cycle of the secondary pulsed input INB 314 is less than the duty cycle of the input signal IN 302.

When the input signal IN 302 transitions from logic low to logic high, the primary pulsed input INA 312 transitions to logic high while the secondary pulsed input INB 314 remains at logic low. The first transistor M1 318 is activated when the primary pulsed input INA 312 is at logic high. The second transistor M2 322 remains inactivated when the secondary pulsed input INB 314 is at logic low.

The first node N1 346 transitions from a first voltage level to a second voltage level. In one example, the first voltage level is equivalent to the voltage supply source Vs 340 and the second voltage level is equivalent to the fixed voltage source Vf 342. The inverted output signal OUTZ 352 transitions from the first voltage level to the second voltage level while the output signal OUT 354 transitions from the second voltage level to the first voltage level. The first voltage level and the second voltage level are stored in the latch 330.

For example, when the input signal IN 302 transitions to logic high for example from 0 volt to 5 volt, the primary pulsed input INA 312 transitions to logic high and the secondary pulsed input INB 314 remains at logic low. This activates the first transistor M1 318 and the second transistor M2 322 remains in inactivated state. When the voltage supply source Vs 340 is, for example, 100 volt; and the fixed voltage source Vf 342 is, for example, 95 volt; the inverted output signal OUTZ 352 transitions from 100 volt to 95 volt and the output signal OUT 354 transitions from 95 volt to 100 volt.

The inverted output signal OUTZ 352 generated at the first node N1 346 is at 95 volt which is considered as logic low whereas the output signal OUT 354 generated at the second node N2 348 is at 100 volt which is considered as logic high. When the first node N1 346 transitions from the first voltage level to the second voltage level, the third logic block 356 generates a first control signal C1 358. The first control signal C1 358 is illustrated as a pulsed signal, as an example. The third transistor M3 360 is activated by the first control signal C1 358. The third transistor M3 360 is active for a duration the first control signal C1 358 is at logic high. This maintains the first node N1 346 at the fixed voltage level. The first transistor M1 318 is active for the duration when the primary pulsed input INA 312 is at logic high.

In one version, when the latch 330 is a back to back inverter (as illustrated in FIG. 3) with the first inverter 326 and the second inverter 328, the fixed voltage level is equal to the second voltage level. In another version, when the latch 330 is an SR latch, the fixed voltage level is equal to the first voltage level.

When the input signal IN 302 transitions from logic high to logic low, the secondary pulsed input INB 314 transitions to logic high while the primary pulsed input INA 312 remains at logic low. The second transistor M2 322 is activated when the secondary pulsed input INB 314 is at logic high. The first transistor M1 318 remains inactive as the primary pulsed input INA 312 is at logic low.

The second node N2 348 transitions from a first voltage level to a second voltage level. In one example, the first voltage level is equivalent to the voltage supply source Vs 340 and the second voltage level is equivalent to the fixed voltage source Vf 342. The output signal OUT 354 transitions from the first voltage level to the second voltage level while the inverted output signal OUTZ 352 transitions from the second voltage level to the first voltage level. The first voltage level and the second voltage level are stored in the latch 330.

For example, when the input signal IN 302 transitions to logic low for example from 5 volt to 0 volt, the secondary pulsed input INB 314 transitions to logic high and the primary pulsed input INA 312 remains at logic low. This activates the second transistor M2 322 and the first transistor M1 318 remains in inactivated state. When the voltage supply source Vs 340 is, for example, 100 volt; and the fixed voltage source Vf 342 is, for example, 95 volt; the output signal OUT 354 transitions from 100 volt to 95 volt and the inverted output signal OUTZ 352 transitions from 95 volt to 100 volt.

The inverted output signal OUTZ 352 generated at the first node N1 346 is at 100 volt which is considered as logic high whereas the output signal OUT 354 generated at the second node N2 348 is at 95 volt which is considered as logic low. When the second node N2 348 transitions from the first voltage level to the second voltage level, the fourth logic block 364 generates a second control signal C2 366. The second control signal C2 366 is illustrated as a pulsed signal, as an example. The fourth transistor M4 370 is activated by the second control signal C2 366. The fourth transistor M4 370 is active for a duration when the second control signal C2 366 is at logic high. This maintains the second node N2 348 at the fixed voltage level. The second transistor M2 322 is active for the duration when the secondary pulsed input INB 314 is at logic high.

In one version, when the latch 330 is a back to back inverter (as illustrated in FIG. 3) with the first inverter 326 and the second inverter 328, the fixed voltage level is equal to the second voltage level. In another version, when the latch 330 is an SR latch, the fixed voltage level is equal to the first voltage level.

FIG. 5 is a flowchart 500 illustrating a method of operation of a level shifter, according to an embodiment. The flowchart 500 is described in reference to the level shifter 300. However, the flowchart 500 can be described and/or practiced by using a system other than the level shifter 300. At step 502, a primary pulsed input is generated in response to an input signal. In level shifter 300, the first logic block 306 generates a primary pulsed input INA 312 in response to the input signal IN 302. The primary pulsed input INA 312 is generated at a rising edge of the input signal IN 302. A duty cycle of the primary pulsed input INA 312 is less than a duty cycle of the input signal IN 302.

At step 504, a first transistor is activated when the primary pulsed input is at logic high. In level shifter 300, when the input signal IN 302 transitions from logic low to logic high, the primary pulsed input INA 312 transitions to logic high. The first transistor M1 318 is activated when the primary pulsed input INA 312 is at logic high.

At step 506, a secondary pulsed input is generated in response to the input signal. For example, in the level shifter 300, the second logic block 308 generates a secondary pulsed input INB 314 in response to the input signal IN 302. The secondary pulsed input INB 314 is generated at a falling edge of the input signal IN 302. A duty cycle of the secondary pulsed input INB 314 is less than the duty cycle of the input signal IN 302.

A second transistor is inactivated when the secondary pulsed input is at logic low, at step 508. In level shifter 300, the second transistor M2 322 is inactivated when the secondary pulsed input INB 314 is at logic low. At step 510, a first node transitions from a first voltage level to a second voltage level. The first node N1 346 transitions from a first voltage level to a second voltage level. In one example, the first voltage level is equivalent to the voltage supply source Vs 340 and the second voltage level is equivalent to the fixed voltage source Vf 342.

For example, when the input signal IN 302 transitions to logic high for example from 0 volt to 5 volt, the primary pulsed input INA 312 transitions to logic high and the secondary pulsed input INB 314 remains at logic low. This activates the first transistor M1 318 and the second transistor M2 322 remains in inactivated state. When the voltage supply source Vs 340 is, for example, 100 volt; and the fixed voltage source Vf 342 is, for example, 95 volt; the first node N1 346 transitions from 100 volt to 95 volt.

When the voltage supply source Vs 340 is, for example, 100 volt; and the fixed voltage source Vf 342 is, for example, 95 volt; the inverted output signal OUTZ 352 transitions from 100 volt to 95 volt and the output signal OUT 354 transitions from 95 volt to 100 volt. At step 512, the first voltage level and the second voltage level are stored in a latch coupled to the first node and a second node. The first node and the second node are coupled to a voltage supply source, for example, the voltage supply source Vs 340.

The level shifter 300 includes a latch 330 coupled to the first node N1 346 and the second node N2 348. In one version, the latch is a back-to-back inverter. In another version, the latch is an SR latch or any other memory storing element known in the art. The first voltage level and the second voltage level are stored in the latch 330. The level shifter, in one example, also includes a set of capacitors between the first node, the second node, the voltage supply source and the fixed voltage source.

For example, the first voltage level i.e. 100 volt is stored at the output terminal of the first inverter 326, and the second voltage level i.e. 95 volt is stored at the input terminal of the first inverter 326. The inverted output signal OUTZ 352 generated at the first node N1 346 is at 95 volt which is considered as logic low whereas the output signal OUT 354 generated at the second node N2 348 is at 100 volt which is considered as logic high.

The method illustrated by flowchart 500 also provides for generating a first control signal when the first node transitions from the first voltage level to the second voltage level. A third transistor is activated by the first control signal to maintain the first node at a fixed voltage level. In level shifter 300, when the first node N1 346 transitions from the first voltage level to the second voltage level, the third logic block 356 generates a first control signal C1 358. The third transistor M3 360 is activated by the first control signal C1 358. This maintains the first node N1 346 at the fixed voltage level.

In one version, when the latch 330 is a back to back inverter (as illustrated in FIG. 3) with the first inverter 326 and the second inverter 328, the fixed voltage level is equal to the second voltage level. In another version, when the latch 330 is an SR latch, the fixed voltage level is equal to the first voltage level.

A second control signal is generated when the second node transitions from the first voltage level to the second voltage level. A fourth transistor is activated by the second control signal to maintain the second node at the fixed voltage level. In level shifter 300, when the second node N2 348 transitions from the first voltage level to the second voltage level, the fourth logic block 364 generates a second control signal C2 366. The fourth transistor M4 370 is activated by the second control signal C2 366. This maintains the second node N2 348 at the fixed voltage level.

The method illustrated by flowchart 500 provides a level shifter which can operate at high frequencies and also requires low area. The level shifter would have no static power losses, and it is also immune to high transients in voltage supply source.

FIG. 6 illustrates a block diagram of an ultrasound system 600, according to an embodiment. The ultrasound system 600 includes a transmitter 604, a transducer 624, and a receiver chain which includes a switch 628, a receiver analog front end (AFE) 630, a digital signal processor (DSP) 636 and a display 640. The ultrasound system 600 is illustrative, and real-world implementations may contain more blocks/components and/or different arrangement of the blocks/components.

The transmitter 604 transmits a pulse signal. The transducer 624 receives the pulse signal from the transmitter 604. The transducer 624 converts electrical signals to ultrasound signals. In one example, the transducer 624 includes an array of transducers. The ultrasound signals are transmitted to the subject's body, and, in response, echoes of the ultrasound signals are reflected from various acoustic impedance discontinuities within the body.

Thus, the transducer 624 receives one or more reflected ultrasound signals. The transducer 624 convert the reflected ultrasound signals to one or more reflected electrical signals. The receiver chain receives the one or more reflected electrical signals. The receiver chain may be implemented on an integrated circuit. In one version, the ultrasound system 600 includes multiple receiver chains, and each receiver chain process a reflected electrical signal of the one or more reflected electrical signals.

The switch 628 is activated when one or more electrical signals are received from the transducer 624. The receiver AFE 630 performs various operations on the one or more electrical signals which includes amplification and filtering. The receiver AFE 630 also includes an analog to digital converter (ADC) that generates a digital data. The receiver AFE 630 provides the digital data to the DSP 636.

The DSP 636 can be, for example, a CISC-type (Complex Instruction Set Computer) CPU, RISC-type CPU (Reduced Instruction Set Computer), or a general purpose processor. The DSP 636 processes the digital data to generate an ultrasound image of a subject. This image is displayed on the display 640.

The transmitter 604 includes a level shifter 606, a driver 614 and a main transistor 618. The level shifter 606 receives an input signal IN 602 and generates an output signal OUT 610. The driver 614 is coupled to the level shifter 606, and generates a drive signal in response to the output signal OUT 610. A gate terminal of the main transistor 618 is coupled to the driver 614, and its source terminal is coupled to a voltage supply source Vs 620. A drain terminal of the main transistor 618 is coupled to the transducer 624.

The drive signal from the driver 614 activates the main transistor 618. The ultrasound system 600 may include multiple transmitters. The level shifter 606 illustrated in the ultrasound system 600 is analogous in connection and operation to the level shifter 300.

Similar to the level shifter 300, the level shifter 606 includes a first logic block and a second logic block. The first logic block and the second logic block receive an input signal. The level shifter 606 includes a first transistor and a second transistor. The first transistor is coupled between the first logic block and a first node. The second transistor is coupled between the second logic block and a second node. The level shifter 606 also includes a latch coupled to the first node and the second node.

The first logic block generates a primary pulsed input in response to the input signal. The primary pulsed input is generated at a rising edge of the input signal. A duty cycle of the primary pulsed input is less than a duty cycle of the input signal. The second logic block generates a secondary pulsed input in response to the input signal. The secondary pulsed input is generated at a falling edge of the input signal. A duty cycle of the secondary pulsed input is less than the duty cycle of the input signal.

The level shifter 606 can operate at higher frequency of operation, and also requires low area as compared to the level shifter 200. The first logic block and the second logic block ensure that the first transistor and the second transistor are activated, respectively, for a short duration. This ensures that the level shifter 606 has no static power losses. The level shifter 606 is also immune to high transients in the voltage supply source Vs 620. The level shifter 606 provides a better delay matching across P/N which results in good linearity.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A level shifter comprising:
a first logic block configured to receive an input signal and configured to generate a primary pulsed input;
a first transistor coupled between the first logic block and a first node, a gate terminal of the first transistor configured to receive the primary pulsed input;
a latch coupled to the first node and a second node;
a second logic block configured to receive the input signal and configured to generate a secondary pulsed input;
a second transistor coupled between the second logic block and the second node, a gate terminal of the second transistor configured to receive the secondary pulsed input;
a third logic block coupled to the first node and configured to generate a first control signal; and
a third transistor whose gate terminal is configured to receive the first control signal and whose source terminal is coupled to a threshold voltage source, and a drain terminal of the third transistor is coupled to the first node.

2. The level shifter of claim 1, wherein the primary pulsed input is generated at a rising edge of the input signal, and a duty cycle of the primary pulsed input is less than a duty cycle of the input signal.

3. The level shifter of claim 1, wherein the secondary pulsed input is generated at a falling edge of the input signal, and a duty cycle of the secondary pulsed input is less than the duty cycle of the input signal.

4. The level shifter of claim 1, wherein the first node and the second node are coupled to a voltage supply source.

5. The level shifter of claim 1 further comprising:
a first capacitor coupled between the voltage supply source and the first node;
a second capacitor coupled between the first node and a fixed voltage source;
a third capacitor coupled between the voltage supply source and the second node; and
a fourth capacitor coupled between the second node and the fixed voltage source.

6. The level shifter of claim 1 further comprising:
a fourth logic block coupled to the second node and configured to generate a second control signal; and
a fourth transistor whose gate terminal is configured to receive the second control signal and whose source terminal is coupled to the threshold voltage source, wherein a drain terminal of the fourth transistor is coupled to the second node.

7. The level shifter of claim 1, wherein a source terminal of each of the first transistor and the second transistor is coupled to a low voltage terminal.

8. The level shifter of claim 1, wherein the latch comprises:
a first inverter whose input terminal is coupled to the first node and whose output terminal is coupled to the second node; and
a second inverter whose input terminal is coupled to the second node and to the output terminal of the first inverter, and whose output terminal is coupled to the first node and the input terminal of the first inverter.

9. The level shifter of claim 1, wherein when the first transistor is activated by the primary pulsed input and the second transistor is inactivated by the secondary pulsed input, a first voltage level and a second voltage level are stored on the latch.

10. A method comprising:
generating a primary pulsed input in response to an input signal;
activating a first transistor when the primary pulsed input is at logic high;
generating a secondary pulsed input in response to the input signal;
inactivating a second transistor when the secondary pulsed input is at logic low;
transitioning a first node from a first voltage level to a second voltage level;
storing the first voltage level and the second voltage level in a latch coupled to the first node and a second node;
generating a first control signal when the first node transitions from the first voltage level to the second voltage level; and
activating a third transistor by the first control signal to maintain the first node at a fixed voltage level, wherein a source terminal of the third transistor is coupled to a threshold voltage source.

11. The method of claim 10 further comprising:
generating a second control signal when the second node transitions from the first voltage level to the second voltage level; and
activating a fourth transistor by the second control signal to maintain the second node at the fixed voltage level, wherein a source terminal of the fourth transistor is coupled to the threshold voltage source.

12. The method of claim 10 further comprising:
generating the primary pulsed input at a rising edge of the input signal, and a duty cycle of the primary pulsed input is less than a duty cycle of the input signal; and
generating the secondary pulsed input at a falling edge of the input signal, and a duty cycle of the secondary pulsed input is less than the duty cycle of the input signal.

13. The method of claim 10 further comprising coupling the first node and the second node to a voltage supply source.

14. The method of claim 10 further comprising coupling a set of capacitors between the first node, the second node, the voltage supply source and a fixed voltage source.

15. An ultrasound system comprising a transmitter, the transmitter further comprising:
a level shifter configured to receive an input signal and configured to generate an output signal;
a driver coupled to the level shifter and configured to generate a drive signal in response to the output signal; and
a main transistor whose gate terminal is coupled to the driver, whose source terminal is coupled to a voltage supply source and whose drain terminal is coupled to a transducer, wherein the level shifter further comprising:
a first logic block configured to receive an input signal and configured to generate a primary pulsed input;
a first transistor coupled between the first logic block and a first node, a gate terminal of the first transistor configured to receive the primary pulsed input;
a latch coupled to the first node and a second node;
a second logic block configured to receive the input signal and configured to generate a secondary pulsed input;
a second transistor coupled between the second logic block and the second node, a gate terminal of the second transistor configured to receive the secondary pulsed input;
a third logic block coupled to the first node and configured to generate a first control signal; and
a third transistor whose gate terminal is configured to receive the first control signal and whose source terminal is coupled to a threshold voltage source, and a drain terminal of the third transistor is coupled to the first node.

16. The ultrasound system of claim 15, wherein the level shifter further comprising:
a third logic block coupled to the first node and configured to generate a first control signal; and
a third transistor whose gate terminal is configured to receive the first control signal and whose source terminal is coupled to a threshold voltage source, wherein a drain terminal of the third transistor is coupled to the first node.

17. The ultrasound system of claim 15, wherein the level shifter further comprising:
a fourth logic block coupled to the second node and configured to generate a second control signal; and
a fourth transistor whose gate terminal is configured to receive the second control signal and whose source terminal is coupled to the threshold voltage source, wherein a drain terminal of the fourth transistor is coupled to the second node.

18. The ultrasound system of claim 15, wherein the primary pulsed input is generated at a rising edge of the input signal, and a duty cycle of the primary pulsed input is less than a duty cycle of the input signal, and wherein the secondary pulsed input is generated at a falling edge of the input signal, and a duty cycle of the secondary pulsed input is less than the duty cycle of the input signal.

* * * * *